United States Patent [19]

Kobayashi et al.

[11] 4,001,863
[45] Jan. 4, 1977

[54] RESIN-SEALED TYPE SEMICONDUCTOR DEVICE

[75] Inventors: Yoshinori Kobayashi; Yoshitaka Shibata; Akira Hasegawa, all of Toyokawa; Yoshiharu Iwatsuki, Aichi, all of Japan

[73] Assignee: Minolta Camera Kabushiki Kaisha, Osaka, Japan

[22] Filed: Dec. 12, 1975

[21] Appl. No.: 640,375

[30] Foreign Application Priority Data

Dec. 19, 1974 Japan .............. 49-147257

[52] U.S. Cl. .................. 357/30; 357/72; 357/74; 174/52 PE
[51] Int. Cl.² .............. H01L 27/14; H01L 31/00; H01L 23/28; H01L 23/02
[58] Field of Search ............ 357/30, 72, 74; 174/52 PE

[56] References Cited

UNITED STATES PATENTS

| | | | |
|---|---|---|---|
| 2,773,158 | 12/1956 | Myers | 357/74 |
| 2,839,646 | 6/1958 | Hester | 357/30 |
| 3,742,599 | 7/1973 | Desmond et al. | 357/72 |
| 3,764,862 | 10/1973 | Jankowski | 357/72 |
| 3,805,375 | 4/1974 | Lacombe et al. | 357/72 |

Primary Examiner—Andrew J. James
Attorney, Agent, or Firm—Wolder & Gross

[57] ABSTRACT

A semiconductor device highly resistant to the normal ambient atmosphere includes a semiconductor element such as a photoconductor element which is fully covered by an adherent layer of a transparent epoxy resin which in turn is coated by a thin layer or film of a transparent chlorinated polypropylene or vinylidene chloride resin. Conductor leads extend from electrodes on the semiconductor element and pass through and are hermetically sealed to the resin layers.

10 Claims, 3 Drawing Figures

RESIN-SEALED TYPE SEMICONDUCTOR DEVICE

BACKGROUND OF THE INVENTION

The present invention relates generally to improvements in electronic devices or components and it relates more particularly to an improved hermetically sealed semiconductor device such as a photoconductive element or the like.

There has been heretofore proposed a photoconductive device of a construction which, as shown in FIG. 1 in the drawings herein, includes a photoconductive film 2 deposited on a substrate 1 by conventional or known coating or vacuum evaporating processes and spaced electrodes disposed thereon. The so fabricated body is shielded from the ambient atmosphere by means of a hermetic case 6, the hermetic case containing an inert gas or dry air therein. The reason why a photoconductor layer should be shielded from the atmosphere is that the photoconductor layer, prepared as above, by the employment of a coating or a vacuum evaporating process, as well as the electrodes are susceptible to to the influence of moisture, oxygen, oil and the like. Although the aforesaid hermetic shielding construction is satisfactory in shielding such a fabricated body from the atmosphere, by the use of a metal and glass, the glass is particularly susceptible to breakage due to heat and external forces, particularly an impact force. Thus, when a crack in the glass occurs, then air enters the interior of the case from outside, thereby lowering and adversely effecting the characteristics of the photoconductive element. Another attempt to provide a photoconductive element is such that a synthetic resin such as epoxy, urethane, or vinyl resin and the like is formed on the surface of a photoconductive film by means of a coating or a molding process. This latter procedure is simple in practice and well adapted for use in mass production, as compared with the sealing process using a hermetic case. In addition, the absence of the use of glass provides mechanical stability. However, the synthetic resin itself suffers from a deficiency in humidity resistance. In other words, active gasses such as moisture and oxygen tend to enter the interior through pinholes or cracks caused in the resin cover due to heat impact, thus failing to afford a construction which provides complete or adequate sealing. It is thus clear from the above, that the hermetically sealed electronic members heretofore proposed or available leave much to be desired.

SUMMARY OF THE INVENTION

It is a principal object of the present invention to provide an improved hermetically sealed electronic device.

Another object of the present invention is to provide an improved resin hermetically sealed semiconductor or solid state electronic device such as a photoconductor or the like in which the ensheathing resin layer is highly humidity resistant and possesses unimpaired excellent light transmission properties, is highly electrically insulating and chemically resistant and is highly adherent to the electronic device substrate.

Still another object of the present invention is to provide a device of the above nature characterized by its reliability, simplicity, low cost, ease of fabrication and high versatility and adaptability.

The above and other objects of the present invention will become apparent from a reading of the following description taken in conjunction with the accompanying drawing which illustrates a preferred embodiment thereof.

In a sense the present invention contemplates the provision of an improved electrical device including an electrical element such as a solid state electrical member which is fully coated by an underlayer of an epoxy resin, the underlayer being in turn externally coated by a layer of a polyvinylidene chloride or a halogenated polyolefin, advantageously, a chlorinated polypropylene having a degree of chlorination of 15% to 70%, preferably about 35%. Electrical conductors extend from the electrical element through the resin layers and are hermetically sealed thereto.

The epoxy resins which may be used in the present structure should advantageously be such as to provide a suitable viscosity and pot life and be adapted for use in the coating operation and should, in addition, possess excellent light resistance, light transmissibility and humidity resistance properties. The chlorinated polypropylene provides (1) a water absorption characteristic of 0.01%–24 hours, (2) a steam or moisture permeability of $8g/m^3$–24 hours, (3) high electrical insulation, (4) good light transmissibility, (5) good light resistance property, (6) suitable chemical resistance property, (7) high heat resistance up to 130° C, and is thus is considered to be most suitable for the plastic shielding of the semiconductor device, particularly of a photoconductive element. In addition, the polypropylene used is of a solvent type, thus allowing free adjustment of the viscosity in coating. The solvents which are employable to advantage include xylene, toluene, and ethyl acetate. Moreover, of importance is the chlorinating rate or degree of chlorination of the polypropylene. The chlorinating rate governs the various characteristics of the propylene film, particularly the adhesiveness to the epoxy film or umdercoating and cracking due to the heat cycle. The influence of the degree of chlorination or chlorinating rate of the polypropylene on the various characteristics of the film are as follows:

| | PROPERTY | CHLORINE CONTENT |
|---|---|---|
| 1. | anti-weathering | the more, the better |
| 2. | oil resistance | the less, the better |
| 3. | heat resistance | minumum at 32 to 34% |
| 4. | dryness | the more, the better |
| 5. | cracking | the less, the better |
| | VARIATION IN CHLORINE CONTENT: | |
| 15% | some problem in light resistance; good adhesiveness to epoxy resin; | |
| 35% | no cracking; good adhesiveness to epoxy resin; | |
| 70% | possibility of cracking; | |

Most suitable chlorine content of polypropylene on an epoxy resin is about 35%, although the above optimum value somewhat varies with the configuration, and size of the semiconductor or the type of epoxy in the underlayer.

In the semiconductor device of the present invention, an epoxy resin layer is used as an underlayer and then a synthetic resin having good humidity resistance is superposed thereon. The present structure provides the following advantages: (1) Because of the use of an epoxy resin as an underlayer there results the following:

a. Good adhesiveness to the substrate. Particularly there is provided excellent adhesiveness in such a boundary portion between the epoxy resin and lead wires, which are liable to absorb humidity, as compared with other resins. In addition, there is provided good electrical insulation.

b. High mechanical strength. There is provided high impact resistance as well as a resistance to a force which will be necessarily incurred to the steps such as folding and bending of lead wires.

c. Epoxy resin is chemically stable irrespective of the type of the material of the substrate. conversely, epoxy resin is freed from the influence of the atmosphere, to which the cell is exposed, or to that of a material which the cell contacts. As a result, the substrate is well protected.

d. Epoxy resin is a synthetic resin which provides good humidity resistance.

e. Epoxy resin permits the use of a dipping process for coating.

(2) Because of the use of a chlorinated polypropylene film there results the following:

a. Chlorinated polypropylene is a synthetic resin which provides the best film forming property and good humidity resistance (a low water adsorption rate and a low moisture permeability).

b. If the chlorine content in the polypropylene resin is suitably selected, this provides good adhesiveness to an epoxy layer.

c. Good electrical insulation.

d. Since the chlorinated polypropylene possesses excellent film forming properties, there results no variation in the coating conditions, depending on the configuration of the substrate.

e. Good chemical resistance.

f. Good mechanical strength. (However, this depends on the content of chlorine. An excessive amount of chlorine (70%) results in brittleness.)

g. Permits a dipping process and mass production.

h. The resin is of a solvent type and dictates the use of a high temperature hardening step.

i. Good light transmissibility. (In the case of application to a photoconductive element).

(3) Because of the aforesaid two layer construction of the above two materials there results the following:

a. Good adhesiveness to the epoxy substrate and good mechanical strength.

b. While the mere use of the epoxy resin coating provides no desired humidity resistance in the range of the film thickness of the order of 200 $\mu$, chlorinated polypropylene provides the desired humidity resistance.

c. If an epoxy resin material adapted for low temperature hardening is used, there may be used a high temperature at the time of coating, nor will there be caused a change in the characteristics of the electronic element.

The use of a combined two layers provides various advantages and hence provides a film construction well adapted for the mass production of resin-sealed electronic parts of a small size.

In the aforesaid description, chlorinated polypropylene has been referred to. However, vinylidene chloride provides the same result. In addition, the description thus far has been limited to the resin sealing of a photoconductive element. However, this may be commonly applied to the various fields including electronic parts and semiconductors which require resin sealing.

DESCRIPTION OF THE PREFERRED EMBODIMENT

Figure 1:
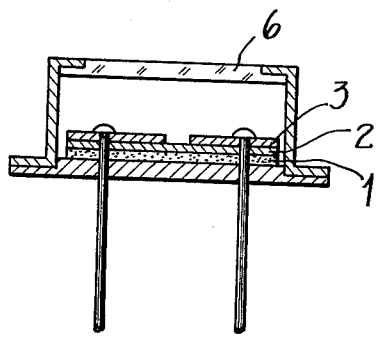
FIG. 1 is a longitudinal cross-sectional view of a prior art hermetically shielded photoconductive element.
Figure 2:
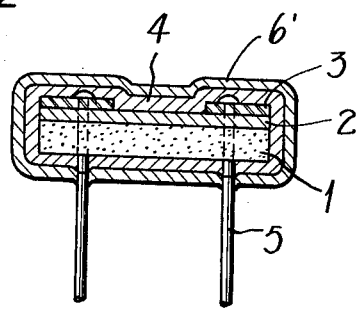
FIG. 2 is a longitudinal cross-sectional view of a device embodying the present invention.

Referring now to the drawing, particularly FIG. 2 thereof which illustrates a preferred embodiment of the present invention, the reference numeral 1 generally designates a substrate which is formed of sintered alumina ($Al_2O_3$). A powdered mixture of cadminum sulfide and cadminum selenide of 40g was placed in a pure water of 100g, and then a sintering flux of 10 mol% and cupric chloride solution as activated impurities were added to the solution in volume of 1 to 2.5cc at a mol-concentration of 1/1000 to the aforesaid powdered mixture of 1g, after which the solution thus prepared was agitated. The solution was then sprayed on the substrate and, after drying, the substrate thus prepared was sintered at 600° C for 15 minutes in a nitrogen atmosphere, thereby forming a photoconductive layer 2. After sintering, the photoconductive layer 2 was rinsed with water to thereby remove residual cadmium chloride and other foreign matter from the surface of the photoconductive layer 2. Indium bismuth or tin was vacuum-evaporated on the photoconductive layer 2 thus obtained to provide spaced ohmic electrodes 3 on the surface of the photoconductive layer 2. Thereafter, lead wires 5 leading out through preformed openings provided in the substrate were secured in place by caulking the walls of the aforesaid openings. The lead wires 5 permit obtaining the information generated by the photoconductive element, even after a synthetic resin coating has been applied. An epoxy layer 4 was then formed over the entire surface of the body of the electrical or semiconductor element prepared as above and was followed by hardening. The thickness of the epoxy film is about 200 $\mu$ and should not be greater than this. After the completion of the hardening of the epoxy resin layer 4, the semiconductor body thus prepared was dipped in polypropylene 6' chlorinated to a chlorine content of 35% for coating thereon. The thickness of the outer layer should be about 100 $\mu$.

Figure 3:
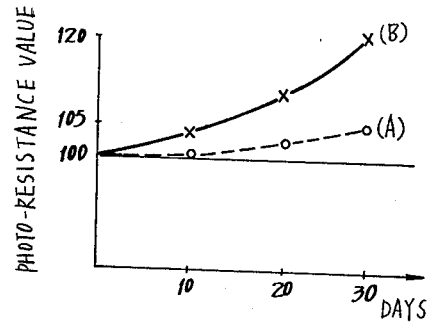
FIG. 3 is a graph comparing the humidity resistance of a resin sealed type device having only an epoxy resin coating.

FIG. 3 represents graphs comparing the variation in the optical resistance of a photoconductive element coated according to the aforesaid embodiments (A) with that of a photoconductive element coated with only an epoxy resin (B), in terms of the time elapsed.

The test conditions were as follows: temperature— 50° C, atmosphere having a relative humidity of 90%, and a period of 30 days (720 hours). The variation in the optical resistance of the element prepared according to the present invention, 30 days after its preparation, is 5%, while that of the element using only an epoxy resin coating is 20% which is four times higher than the aforesaid variation of 5%, thus demonstrating the excellency of the element prepared according to the present invention.

While there has been described and illustrated a preferred embodiment of the present invention, it is apparent that numerous alterations, omissions and additions may be made without departing from the spirit thereof.

We claim:

1. A semiconductor device comprising a semiconductive element, a film underlayer of an epoxy resin material entirely covering said semiconductive element, a film outer layer of chlorinated polypropylene entirely covering said underlayer, and electric conductive means electrically connected to said semiconductive element and extending through said film underlayer and said film outer layer.

2. A semiconductor device as set forth in claim 1 wherein said semiconductive element includes a substrate and photoconductive material coated thereon.

3. A semiconductor device as set forth in claim 2 wherein said outer layer contains 35% chlorine.

4. A semiconductor device as set forth in claim 3 wherein the thickness of said underlayer is 200 $\mu$ and thickness of said outer layer is 100 $\mu$.

5. A semiconductor device comprising a semiconductive element, a film underlayer of epoxy resin material entirely covering said semiconductive element, a film outer layer of vinylene chloride resin material entirely covering said underlayer, and electric conductive means connected to said semiconductive element and extending through said underlayer and said outer layer.

6. A semiconductor device as set forth in claim 5 wherein said semiconductive element includes a substrate and a photoconductive material coated thereon.

7. An electrical device comprising a solid state electrical member, a first film layer of an epoxy resin substantially completely coating said electrical member, a second film layer of chlorinated polypropylene or vinylidene chloride substantially completely coating the outer face of said first layer and a plurality of electrical conductors coupled to said electrical member and passing through said first and second layers.

8. The electrical device of claim 7 wherein said is a chlorinated polypropylene has a degree of chlorination of between 15% and 70%.

9. The electrical device of claim 8 wherein said electrical member comprises an insulating substrate having a photoconductive layer on a face thereof and a pair of spaced electrodes superimposed on said photoconductive layers, said electrical conductors being connected to said electrodes, said first and second layers being light transmissive.

10. The electrical device of claim 9 wherein said first layer is of a thickness of about 200 $\mu$ and said second layer is of a thickness of about 100 $\mu$ and is formed of chlorinated polypropylene with a degree of chlorination of about 35%.

* * * * *